(12) United States Patent
Eldesouki

(10) Patent No.: US 8,586,908 B2
(45) Date of Patent: Nov. 19, 2013

(54) TIME-DELAY INTEGRATION THROUGH REDUCTION OF DELAY BETWEEN SUBSEQUENT CAPTURE OPERATIONS OF A LIGHT-DETECTION DEVICE

(71) Applicant: Munir Eldesouki, Ontario (CA)

(72) Inventor: Munir Eldesouki, Ontario (CA)

(73) Assignee: King Abdulaziz City Science and Technology, Riyadh (SA)

( * ) Notice: Subject to any disclaimer, the term of this patent is extended or adjusted under 35 U.S.C. 154(b) by 0 days.

(21) Appl. No.: 13/779,718

(22) Filed: Feb. 27, 2013

(65) Prior Publication Data

US 2013/0168535 A1    Jul. 4, 2013

Related U.S. Application Data

(63) Continuation of application No. 12/769,988, filed on Apr. 29, 2010, now Pat. No. 8,410,416.

(51) Int. Cl.
*H01J 40/14*  (2006.01)
*H03L 5/00*  (2006.01)

(52) U.S. Cl.
USPC ........................................ 250/214 R; 327/326

(58) Field of Classification Search
USPC ............................. 250/214 R, 214.1; 327/326
See application file for complete search history.

(56) References Cited

U.S. PATENT DOCUMENTS 8,410,416 B2 *    4/2013    Eldesouki et al. ........ 250/214 R

* cited by examiner

*Primary Examiner* — Thanh Luu
(74) *Attorney, Agent, or Firm* — Raj Abhyanker, P.C.

(57) ABSTRACT

Disclosed are a system, a method and an apparatus of reduction of delay between subsequent capture operations of a light-detection device. In one embodiment, a light-detection circuit includes an avalanche photodiode implemented in a deep submicron CMOS technology. In addition, the light-detection circuit includes a passive quench control circuit to create an avalanche current that generates a high voltage at an output of a second inverter gate of the circuit. The light-detection circuit further includes an active quench control circuit to reduce a dead time of the circuit. The light-detection circuit also includes a reset circuit to create a low voltage at an output of the second inverter gate and to create an active reset through a PMOS transistor of the light-detection circuit.

24 Claims, 12 Drawing Sheets

| TECHNOLOGY (CMOS) 802 | DCR 804 | DIAMETER 806 | DEAD TIME 808 | BREAKDOWN VOLTAGE 810 |
|---|---|---|---|---|
| 0.35 μM | 2 KHZ @ 3 $V_E$ | 20 μM | 40 NS | 24.0 V |
| 0.18 μM | 70 KHZ @ 0.5 $V_E$ | 10 μM | 30 NS | 10.2 V |
| 0.13 μM | 100 KHZ @ 1.7 $V_E$ | 10 μM | 450 NS | 9.4 V |
| 0.18 μM | 10 KHZ @ 0.7 $V_E$ | 7 μM | - - - | 11.0 V |
| 0.35 μM | 4 KHZ @ 4 $V_E$ | 20 μM | 500 NS | 27.5 V |
| 0.18 μM | 100 KHZ @ 0.5 $V_E$ | 10 μM | - - - | 10.0 V |
| 0.13 μM | 1 KHZ @ 0.3 $V_E$ | 10 μM | 50 NS | 11.3 V |

TABLE VIEW 850

FIGURE 8

| TECHNOLOGY (CMOS) 902 | DEAD TIME 904 | COUNT RATE 906 | PIXEL AREA 908 |
|---|---|---|---|
| 0.8 µm HV CMOS | 34 ns | 30 Mcps | n/a |
| 0.35 µm HV CMOS | 40 ns | 20 Mcps | (100µm * 50µm) |
| 0.18 µm HV CMOS | 30 ns | 30 Mcps | (120µm * 80µm) |
| 0.8 µm HV CMOS | 30 ns | 30 Mcps | n/a |
| 0.8 µm HV CMOS | 50 ns | 20 Mcps | SPAD off-chip |
| 0.8 µm HV CMOS | 30 ns | 40 Mcps | SPAD off-chip |
| 1 µm IIV CMOS | 36 ns | 25 Mcps | SPAD off-chip |
| 0.18 µm IIV CMOS | 5 ns | 200 Mcps | (180µm * 96µm) |
| 0.8 µm HV CMOS | <10 ns | 100 Mcps | n/a |
| 0.7 µm IIV CMOS | 32 ns | 30 Mcps | n/a |
| 0.13 Mm CMOS | 250 ps | 4 Gcps | **(26µm * 25µm)** |

TABLE VIEW 950

TIME-DELAY INTEGRATION THROUGH REDUCTION OF DELAY BETWEEN SUBSEQUENT CAPTURE OPERATIONS OF A LIGHT-DETECTION DEVICE

CLAIM OF PRIORITY

This application is a continuation-in-part patent application of U.S. patent application Ser. No. 12/769,988 titled REDUCTION OF DELAY BETWEEN SUBSEQUENT CAPTURE OPERATIONS OF A LIGHT-DETECTION DEVICE filed on Apr. 29, 2010.

FIELD OF TECHNOLOGY

This disclosure relates generally to a technical field of electronic circuits and, in one example embodiment, to a system, method and an apparatus of implementing time-delay integration through reduction of delay between subsequent capture operations of a light-detection device.

BACKGROUND

A light-detection technique may count individual photons to measure intensity of light (e.g., a single photon counting (SPC) technique). For example, incident photons may be counted individually over a period of time to obtain a measure of light intensity and/or flux during an imaging operation.

A circuit to implement the light-detection technique may be complex. The complexity of the circuit may reduce image resolution because of a lower fill factor and/or an increased pixel size. The increased pixel size may prevent a use of the circuit as arrays.

A delay (e.g., a dead-time) may be created after a photon is received until a circuit (e.g., a light-detection circuit) is ready to receive another photon. A reduction of the delay may be prevented because of an implementation of the circuit on a slow semiconductor technology. For example, a solid-state single photon counter that is integrated on a microchip may be implemented in a long channel technology that uses a semiconductor with a lower doping level. The reduction of the delay may also be prevented because of an afterpulse caused by a trapped carrier being released. The afterpulse may be counted as incident photons leading to an inaccuracy in a photon count. As a result, the delay may limit an upper photon count rate, making the light-detection technique unsuitable in an application (e.g., a biomedical application, a military application, a nighttime imaging operation, a low light imaging operation) requiring high-speed processing during the imaging operation.

In some applications, such as satellite imaging, an image sensor device may utilize time-delay integration (TDI) to increase sensitivity due to low light conditions or due to objects moving at high speeds. As such, the image sensor device may require a short integration time to avoid blurring of the image. Conventional TDI systems may use charge-coupled devices to facilitate charge transfer, which is required in TDI to shift a charge from one pixel to another in a manner synchronized with the movement of an object being captured by the image sensor device.

However, the large amount of circuitry in conventional CCDs of current image sensor devices may limit a resolution of the image sensor device. For applications such as satellite imaging, a low resolution image may degrade the overall appearance of the image and may cause certain infinitesimal features, such as stars, to be obscured. Furthermore, to facilitate TDI, a high bandwidth operation amplifier may be required to enable and maintain high speed operation. However, the inclusion of an operation amplifier would further limit the layout area of the circuitry. Also, analog solutions may require an additional analog to digital conversion process as in conventional CCD-based TDI imagers.

SUMMARY

Disclosed are a system, a method and an apparatus of reduction of delay between subsequent capture operations of a light-detection device. In one aspect, a light-detection circuit includes an avalanche photodiode implemented in a deep submicron CMOS technology. In addition, the light-detection circuit includes a passive quench control circuit to create an avalanche current that generates a high voltage at an output of a second inverter gate of the circuit. The light-detection circuit further includes an active quench control circuit to reduce a dead time of the circuit. The light-detection circuit also includes a reset circuit to create a low voltage at an output of the second inverter gate and to create an active reset of a PMOS transistor of the circuit.

The avalanche photodiode may be operated in a Geiger mode of operation. The passive quench control circuit, the active quench control circuit, and the reset circuit may operate in concert to reduce a dead time of the circuit to at most 250 ps. The deep submicron CMOS technology may be a 130 nm CMOS technology having a breakdown voltage of 11.3V. The light-detection circuit may be a single photon counter device that operates the avalanche photodiode at an operating point that reduces an afterpulsing effect. The avalanche photo diode, a first inverter gate and the second inverter gate operate at different voltage points. A number of components needed to operate the circuit may be reduced when the gate delay of the first inverter gate and/or the second inverter gate in the circuit replaces a delay circuit. A layout area of the circuit may be proportionally reduced when the number of components needed to operate the circuit is reduced.

A speed of operation of the circuit increases through the reduction of the number of components. A fill factor of the layout area to increase when the first inverter gate and/or the second inverter gate are present in the circuit. The fill factor is an area occupied by the active area of avalanche photodiode as compared to a combined circuit layout area of the avalanche photodiode and remaining portions of the circuit.

In another aspect, a light-detection device includes an avalanche photodiode implemented in a deep submicron CMOS technology to operate in a Geiger mode of operation. In addition, the light-detection device includes a set of control modules to reduce a dead time of the circuit.

A fill factor of the layout area to increase when the first inverter gate and the second inverter gate are present in the light-detection device. The fill factor is an active area occupied by the avalanche photodiode as compared to a combined light-detection device layout area of the avalanche photodiode and remaining portions of the light-detection device.

In yet another aspect, a method includes generating an avalanche current through an avalanche photodiode implemented in a deep submicron CMOS technology. The method also includes reducing a dead time through an active quench control mode.

The method may include generating a high voltage at an output of a second inverter gate when the avalanche current is created. The method may also include creating a low voltage at an output of the second inverter gate in a reset mode. The method may further include resetting a PMOS transistor through the reset mode.

An afterpulsing effect in a single photon counter device may be reduced when the avalanche photodiode is operated at an operating point that enables reducing the afterpulsing. A number of components may be reduced when the gate delay of the first inverter gate and the second inverter gate in the circuit replaces a delay operation. A layout area may be proportionally reduced when the number of components is reduced. A speed of operation may be increased through the reduction of the number of components. A fill factor of the layout area may be increased when the first inverter gate and the second inverter gate are present. The fill factor may be an active area occupied by the avalanche photodiode as compared to a combined layout area of the avalanche photodiode and remaining components.

The methods, systems and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE VIEWS OF DRAWINGS

Example embodiments are illustrated by way of example and not limitation in the figures of accompanying drawings, in which like references indicate similar elements and in which:

FIG. 8 is a table view illustrating the dead time provided by deep submicron (DSM) single photon avalanche diode (SPAD) with passive quench implemented on various other techniques and the technique used herein, according to one or more embodiments.

Other features of the present embodiments will be apparent from accompanying Drawings and from the Detailed Description that follows.

DETAILED DESCRIPTION

Disclosed are a system, a method and an apparatus of reduction of delay between subsequent capture operations of a light-detection device. It will be appreciated that the various embodiments discussed herein need not necessarily belong to the same group of exemplary embodiments, and may be grouped into various other embodiments not explicitly disclosed herein. In the following description, for purposes of explanation, numerous specific details are set forth in order to provide a thorough understanding of the various embodiments.

Figure 1:
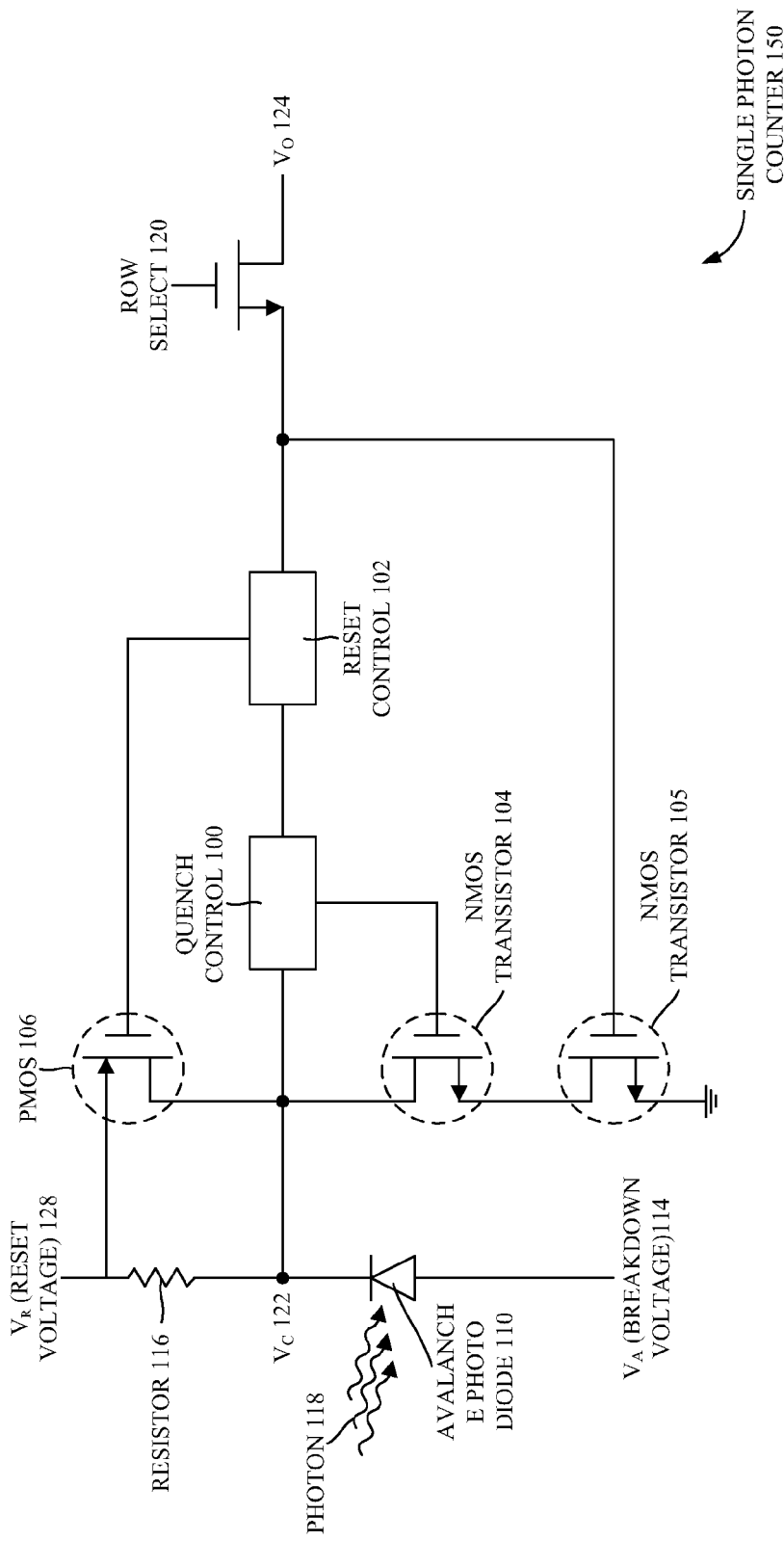
FIG. 1 is a circuit view of a single photon counter, according to one or more embodiments.

FIG. 1 is a circuit view of a single photon counter 150, according to one or more embodiments. In one or more embodiments, the single photon counter 150 may be a circuit configured to detect and measure intensity of light. In one or more embodiments, incident photons may be counted individually over a period of time to obtain a measure of light intensity and/or flux during an imaging operation. In one or more embodiments, the single photon counter 150 as described herein may be designed such that a dead time and an afterpulsing effect are reduced significantly. In on or more embodiments, a high speed single-photon avalanche photodiode may be used in the single photon counter 150 to achieve a very low dead time. Also, in one or more embodiments, a set of control modules may be configured to reduce a dead time of the single photon counter 150. In one or more embodiments, the set of control modules may include an active control module, a passive control module and a reset module.

In one or more embodiments, the single photon counter 150 as illustrated may include a quench control 100, a reset control 102, n-channel enhancement-type MOSFET (NMOS) transistors 104-105, a p-channel enhancement-type MOSFET (PMOS) transistor 106, the avalanche photodiode 110, a breakdown voltage ($V_A$) 114, a resistor 116, a photon 118, a row select 120, a reset voltage ($V_R$) 122, an output voltage ($V_O$) 124 and avalanche voltage $V_C$ 122. In one or more embodiments, the quench control may be a circuitry configured to reduce an electric field below a breakdown to stop the self-sustaining avalanche current. In one or more embodiments, an avalanche current may be generated through the avalanche photodiode 110. In one or more embodiments, the quench control may include a passive quench circuit and an active quench circuit. In one or more embodiments, the reset control 102 may be circuitry of the single photon counter 150 configured to reset the avalanche photodiode 110 into a normal state. In one or more embodiments, the NMOS transistors 104-105 are the transistors configured for quenching. In one or more embodiments, the PMOS transistor 106 may be the transistor configured for performing a reset operation.

In one or more embodiments, the avalanche photodiode 110 may be used for detection of a photon. In one or more embodiments, the avalanche photodiode 110 may be a photodetector which may be operated with a reverse bias. In one or more embodiments, the avalanche photodiode 110 may be semiconductor based component. In one or more embodiments, the avalanche photodiode 110 may be a single-photon avalanche photodiode (e.g., Single photon Avalanche Diode (SPAD), Geiger Mode-Avalanche Photo Diode (G-APD)). In one or more embodiments, the avalanche photodiode 110 may be implemented in a deep submicron Complimentary Metal-Oxide-Semiconductor (CMOS) technology. In one or more embodiments, the deep submicron CMOS technology may be a 130 nm CMOS technology having a breakdown voltage of 11.3V. In one or more embodiments, the $V_O$ 124 may be an output voltage for external circuits.

In one or more embodiments, the design of the single photon counter 150 as described herein may be implemented using a deep-submicron (DSM) CMOS technology that allows a nominal supply voltage of 1.2V. In one or more embodiments, the invertors (e.g., the first inverter gate 208 and the second inverter gate 210) may be biased at a supply voltage $V_{DD}$ of 1.5 V.

In one or more embodiments, since, there may be more photon counters, the row select 120 transistor may be used to select a particular photon counter. The row select 120 as illustrated herein one embodiment may be made of a NMOS transistor. In one or more embodiments, the number of components required to operate the single photon counter 150 may be reduced when the gate delay offered by the first inverter gate 208 and the second inverter gate 210 in the single photon counter 150 replaces a delay circuit. Also, in one or more embodiments, a speed of operation of the single photon counter 150 may be increased through the reduction of the number of components. The working of the single photon counter 150 may be illustrated in forthcoming figures.

Figure 2:
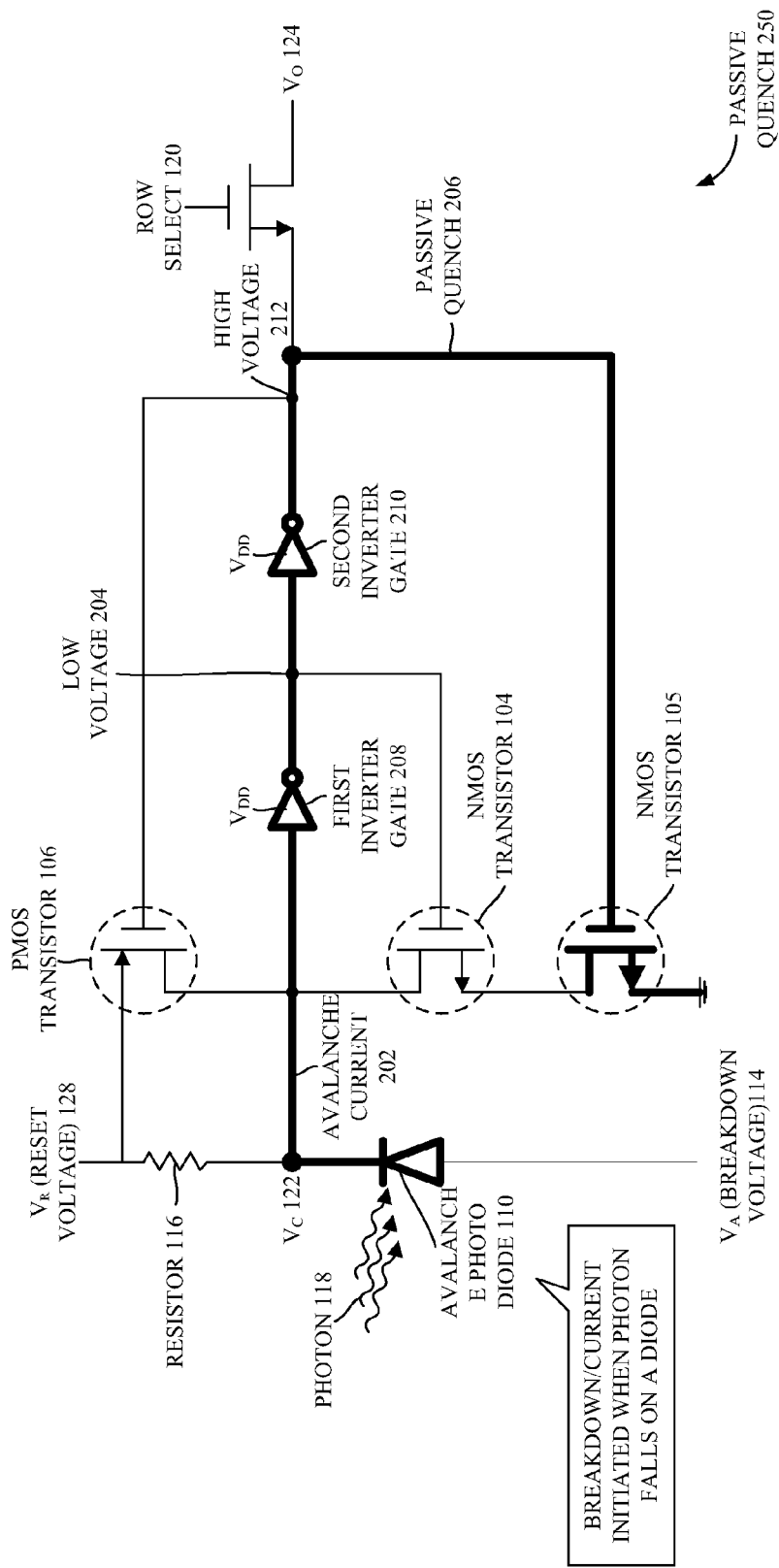
FIG. 2 is a schematic view of the single photon counter of FIG. 1 illustrating a passive quench operation, according to one or more embodiments.

FIG. 2 is a schematic view of the single photon counter 150 of FIG. 1 illustrating a passive quench operation 250, according to one or more embodiments. In one or more embodiments, the passive quench control circuit 206 (e.g., the passive quench control module) of the light-detection circuit (e.g., the single photon counter 150) may be configured to create an avalanche current that generates a high voltage at an output of the second inverter gate 210 of the single photon counter 150. In one or more embodiments, when the photon is incident on the avalanche photodiode 110, a breakdown is initiated in the avalanche photodiode 110 due to the characteristics of the avalanche photodiode 110. In one or more embodiments, the avalanche photodiode 110 as described herein may be operated in a Geiger Mode.

In one or more embodiments, the Geiger mode may be a mode of operation of the avalanche photodiode 110, where the avalanche photodiode 110 may be operated above the breakdown threshold voltage. In one or more embodiments, in Geiger mode, the breakdown mechanism of the avalanche photodiode 110 may be designed to be avalanche multiplication, where photogenerated carriers multiply by impact ionization in a high electric field depletion region of the avalanche photodiode 110, thus triggering a self-sustaining avalanche process which delivers a current pulse in the milliAmpere range to the external circuit.

In one or more embodiments, the number of photogenerated carriers generated as a result of the absorption of a single photon determines the optical gain of the avalanche photodiode 110 which may be infinite. In one or more embodiments, the breakdown may also occur by tunneling, which reduces the optical gain. In one or more embodiments, the electric field profile within the depletion region of the avalanche photodiode 110 may be designed to avoid band-to-band tunneling effects. In one or more embodiments, as the breakdown process is initiated (e.g., due to an incident photon generating an electron-hole pair or due to thermal generation), a self-sustained avalanche current may flow through resistor 116. In one or more embodiments, the self-sustaining avalanche current would continue flowing without stopping unless the electric field in the depletion region of the avalanche photodiode 110 is reduced below the breakdown. In one or more embodiments, the electric field may be reduced below the breakdown and the avalanche current may be stopped using the circuits of the quenching control 100.

In one or more embodiments, the quenching control may be designed as illustrated in the FIGS. 1-4. In one or more embodiments, a resistor 116 with a high resistance value may be used in series with the avalanche photodiode 110, as illustrated in the FIGS. 1-4. In one or more embodiments, the passive quench circuit is implemented using a first inverter gate 208, a second inverter gate 210, and the NMOS transistor 105.

In one or more embodiments, since the $V_C$ 122 is high due to breakdown current which may be generated by an incident photon on the avalanche photo diode, an output of the first inverter gate 208 is low as the input to the first inverted 208 is high. The low output from the first inverter gate 208 may turn off the NMOS transistor 104. However, the output of the second inverter gate 210 is high (e.g., high voltage 212), which turns on the NMOS transistor 105 and turns off the PMOS transistor 106. The second inverter gate 210 being turned on enables passive quenching 206 due to turning on the NMOS transistor 105. In one or more embodiments, the voltage $V_C$ 122 may be dropped due passive quenching which turns on the NMOS transistor 105, in turn which pulls down the $V_C$ 122.

In one or more embodiments, the single photon counter 150 (e.g., light-detection circuit) may be configured to operate the avalanche photodiode 110 at an operating point that reduces an afterpulsing effect. In one or more embodiments, the operating point for reducing the afterpulsing effect may be chosen by providing an excess low bias of 300 mV. In addition, in one or more embodiments, the avalanche photodiode 110 and the first inverter gate 208 and the second inverter gate 210 may be configured to operate at different voltage points.

Figure 3:
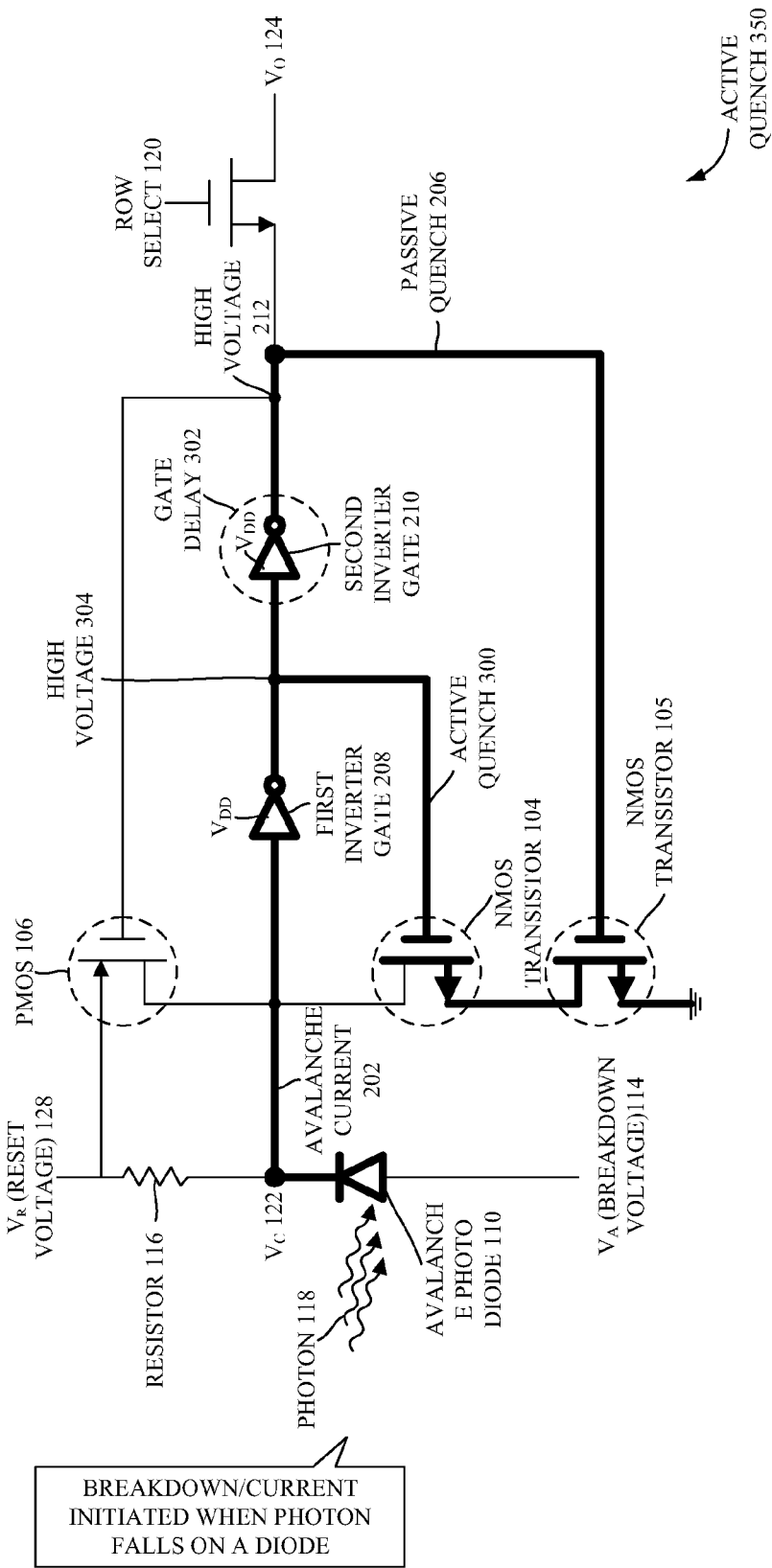
FIG. 3 is a schematic view of the single photon counter of FIG. 1 illustrating continuation of FIG. 2 and an active quench operation, according to one or more embodiments.

FIG. 3 is a schematic view of the single photon counter 150 of FIG. 1 illustrating continuation of FIG. 2 and an active quench operation 350, according to one or more embodiments. In one or more embodiments, an active quench control circuit 300 (e.g., the active quench control module) of the light-detection circuit (e.g., the single photon counter 150) may be configured to reduce a dead time of the single photon counter 150. In one or more embodiments, as soon as the passive quenching is detected by the NMOS transistor 105 due to triggering an avalanche process, the output of the first inverter gate 208 becomes high 304, turning on the NMOS transistor 104 as illustrated in FIG. 3. In one or more embodiments, since the NMOS transistor 105 is in 'on' state, the pull down path is turned on and the active quenching process is initiated. In one or more embodiments, the active quenching process continues until the output of the second inverter gate 210 becomes low because of the output of the first inverter gate 208. In one or more embodiments, the time period of the active quenching may be designed based on the gate delay 302. In one or more embodiments, the sizes of the transistors (e.g., the NMOS transistors 104-105 and the PMOS transistor 106) may be carefully designed and implemented in the layout to achieve the gate delay 302 that will maintain stable operation.

Figure 4:
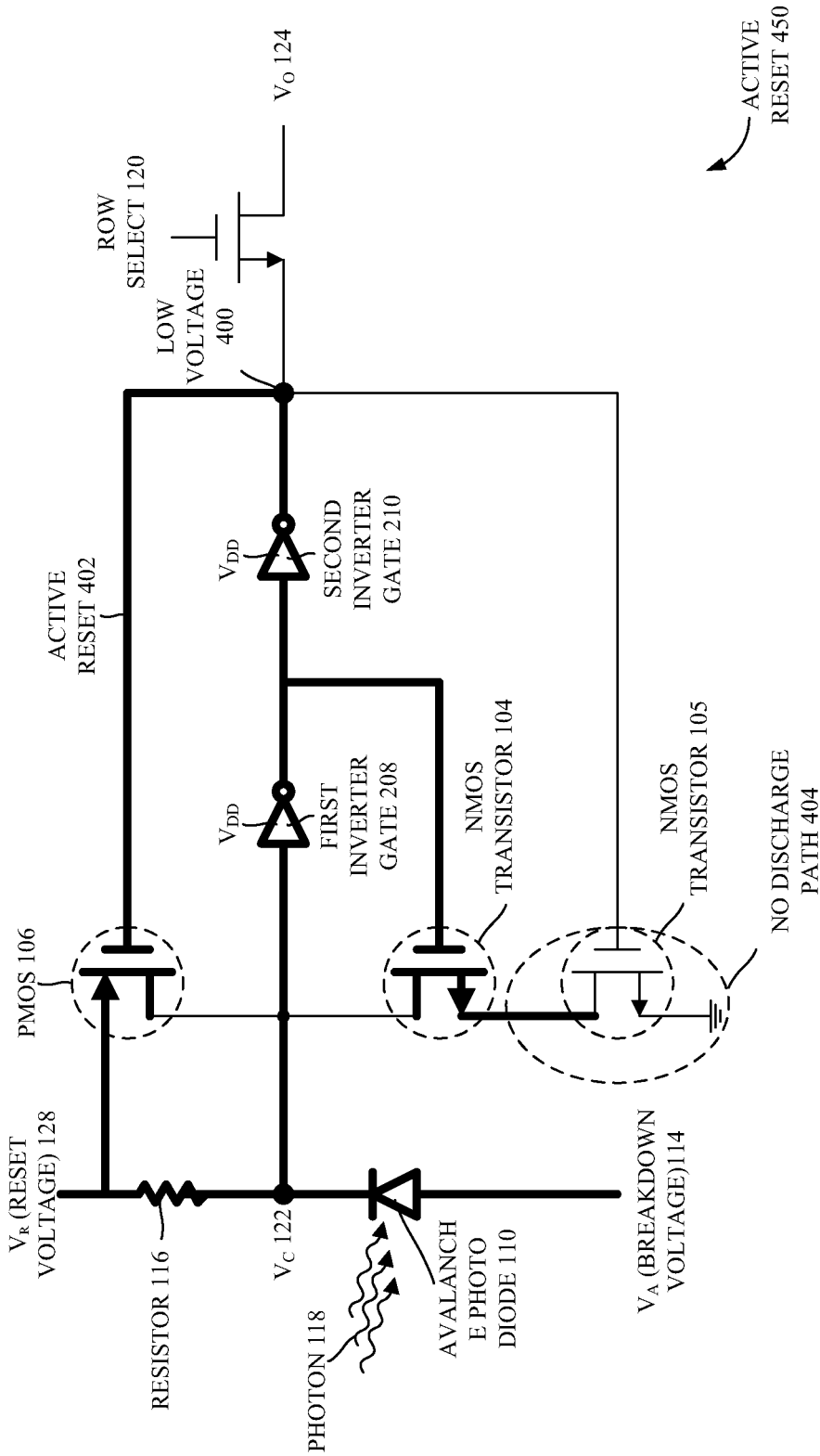
FIG. 4 is a schematic view of the single photon counter of FIG. 1 illustrating continuation of FIG. 3 and an active reset operation, according to one or more embodiments.

FIG. 4 is a schematic view of the single photon counter 150 of FIG. 1 illustrating continuation of FIG. 3 and an active reset operation 450, according to one or more embodiments. In one or more embodiments, the reset circuit 402 (e.g., the active quench control module) of the light-detection circuit (e.g., the single photon counter 150) may be configured to create a low voltage at an output of the second inverter gate 210 and to create an active reset 450 through a PMOS transistor 106 of the single photon counter 150. In one or more embodiments, as the output of the first inverter gate 208 triggers the second inverter gate 210 to generate a low voltage signal 400, the NMOS transistor 105 is turned off stopping the active quench as there is no discharge path 404. In addition, due to low output of the second inverter gate 210 the PMOS transistor 106 is turned on leading to an active reset 402 operation. Also, though the NMOS transistor 104 is in on state, there is no quenching because of absence of discharge path 404 due to turning off of the NMOS transistor 105. Further, the avalanche photodiode voltage $V_C$ 122 is set to the reset voltage $V_R$ 128 due to the PMOS transistor 106. In other words, the PMOS transistor 106 pulls avalanche photodiode voltage $V_C$ 122 to reset voltage $V_R$ 128 rendering the avalanche photodiode 110 out of the Geiger mode. Further, the voltage $V_C$ 122 may increase according to the product of the circuit resistance of resistor 116 and the avalanche photodiode 110 capacitance (e.g., based on RC time constant) in addition to the parasitic capacitance.

In one or more embodiments, the single photon counter 150 will continue to be in active reset mode until all the avalanche photodiode voltage $V_C$ 122 becomes high again driving the output of the second inverter back to high. In one or more embodiments, the time at which the single photon counter 150 stays in active quench mode may be dependent on the delay of the first inverter gate 208 and the second inverter gate 210, which was controlled by carefully selecting the sizes of the transistors (e.g., the NMOS transistors 104-105 and the PMOS transistor 106) in the circuit to achieve a delay that will maintain stable operation. In one or more embodiments, the passive quench control circuit 206, the active quench control circuit 300, and the reset circuit 402 may be configured to operate in concert to reduce a dead time of the single photon counter 150 to at most 250 ps.

In one or more embodiments, since the high speed avalanche photodiode is used, a low dead time may be achieved by the photon counting device 150. In one or more embodiments, the afterpulsing may be reduced by operating the photon counting device 150 at a low voltage and providing a low avalanche photodiode breakdown voltage 114 (e.g., bias voltage) as supported by the DSM CMOS technology that allows a nominal supply voltage of 1.2V. In one or more embodiments, the inverters may be biased at 1.5 V, while lower voltages close to 0.9 V may be provided as the reset voltage $V_R$ 128. By controlling the terminal voltage $V_A$ 114, the avalanche photodiode 110 may be operated with a low excess bias (e.g., as low as 200 mV) to achieve low afterpulsing values.

By having a separate reset voltage level for the avalanche photodiode 110 than for the inverters 206-208 in the single photon counter 150, and by controlling the excess bias using the breakdown voltage $V_A$ 114, the voltage of the avalanche photodiode 110 may be varied to the optimal operating point required for the application. Using a low excess bias of 300 mV, the avalanche photodiode 110 allows for a low afterpulsing probability due to reducing the avalanche current.

In one or more embodiments, the afterpulsing may be due to secondary avalanches that were triggered by carriers being captured by deep trap levels in the junction depletion layer during the breakdown process and subsequently released with a statistically fluctuating delay. Released photocarriers may retrigger the avalanche, generating afterpulses that are correlated with a previous avalanche pulse. In one or more embodiments, the afterpulse may be dependent on the excess breakdown voltage $V_A$ 114. When the breakdown voltage $V_A$ 114 is high, the electric field increases in the depletion region of the avalanche photodiode 110, more photocarriers may cross the depletion region, thus increasing the number of trapped carriers, as well as increasing the probability of released carrier triggering an avalanche. In one or more embodiments, since a low voltage is used as the breakdown voltage $V_A$ 114, there will be a low afterpulsing probability due to reducing avalanche current. In other words, controlling the excess bias using the breakdown voltage VA 114, there may be less photocarriers reducing the avalanching current and hence reduced afterpulsing.

Figure 5:
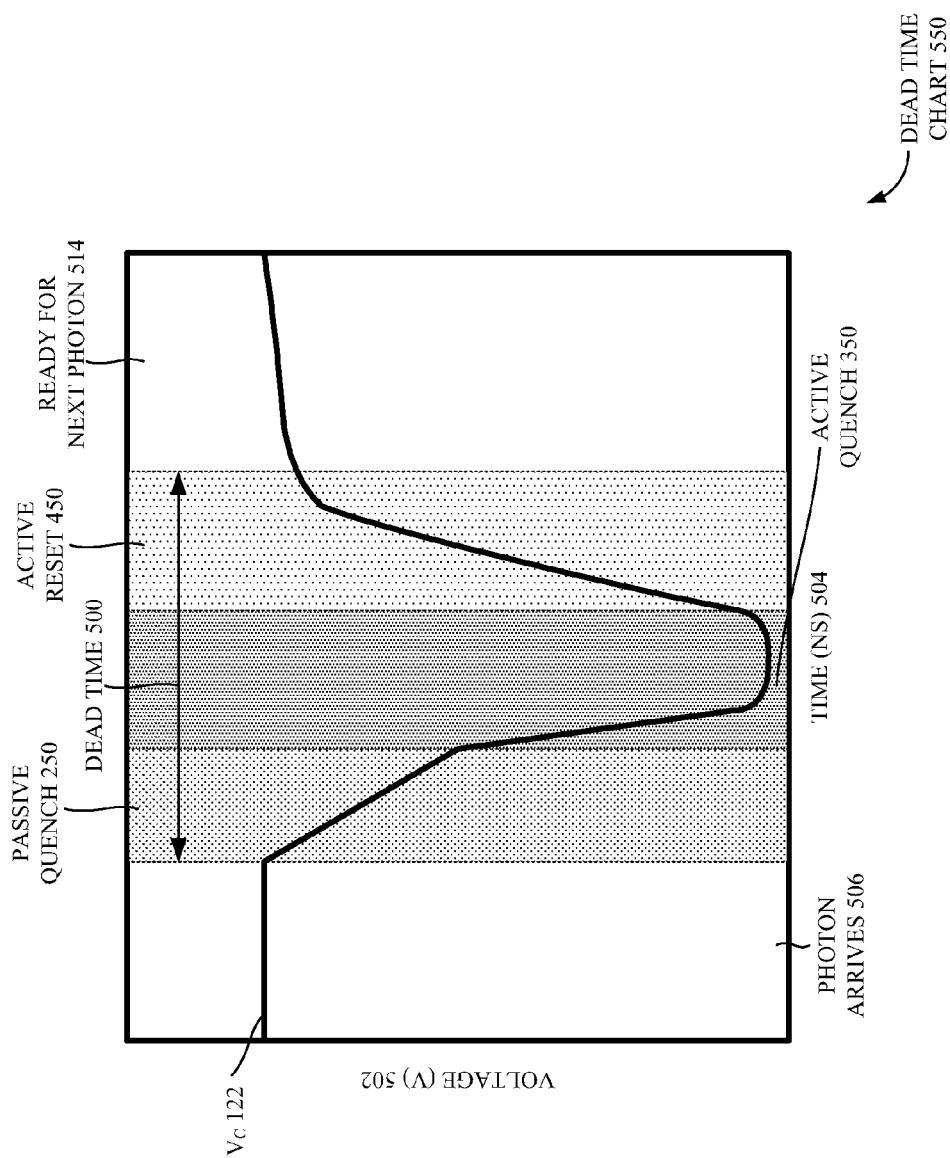
FIG. 5 is a graphical view illustrating a dead time chart, according to one or more embodiments.

FIG. 5 is a graphical view illustrating a dead time chart 550, according to one or more embodiments. In one or more embodiments, the dead time chart 550 as illustrated in FIG. 5 provides information of voltage waveform during photon detection. The time between the passive quenching 250, the active quenching 350 and the active reset 450 may be dead time 500. In one or more embodiments, the dead time 500 may be a time period in which the avalanche photodiode 110 may not be able to respond to any incident photons. In addition, the avalanche voltage $V_C$ 122 may be drop significantly during quenching. The voltage drop may be maximum during the active quench 350 as illustrated. Further, the voltage $V_C$ 122 may increase in active reset 450 time period due to RC time constant. The voltage $V_C$ 122 may regain the original voltage value to enable the avalanche photodiode 110 for the next photon 514.

Figure 6:
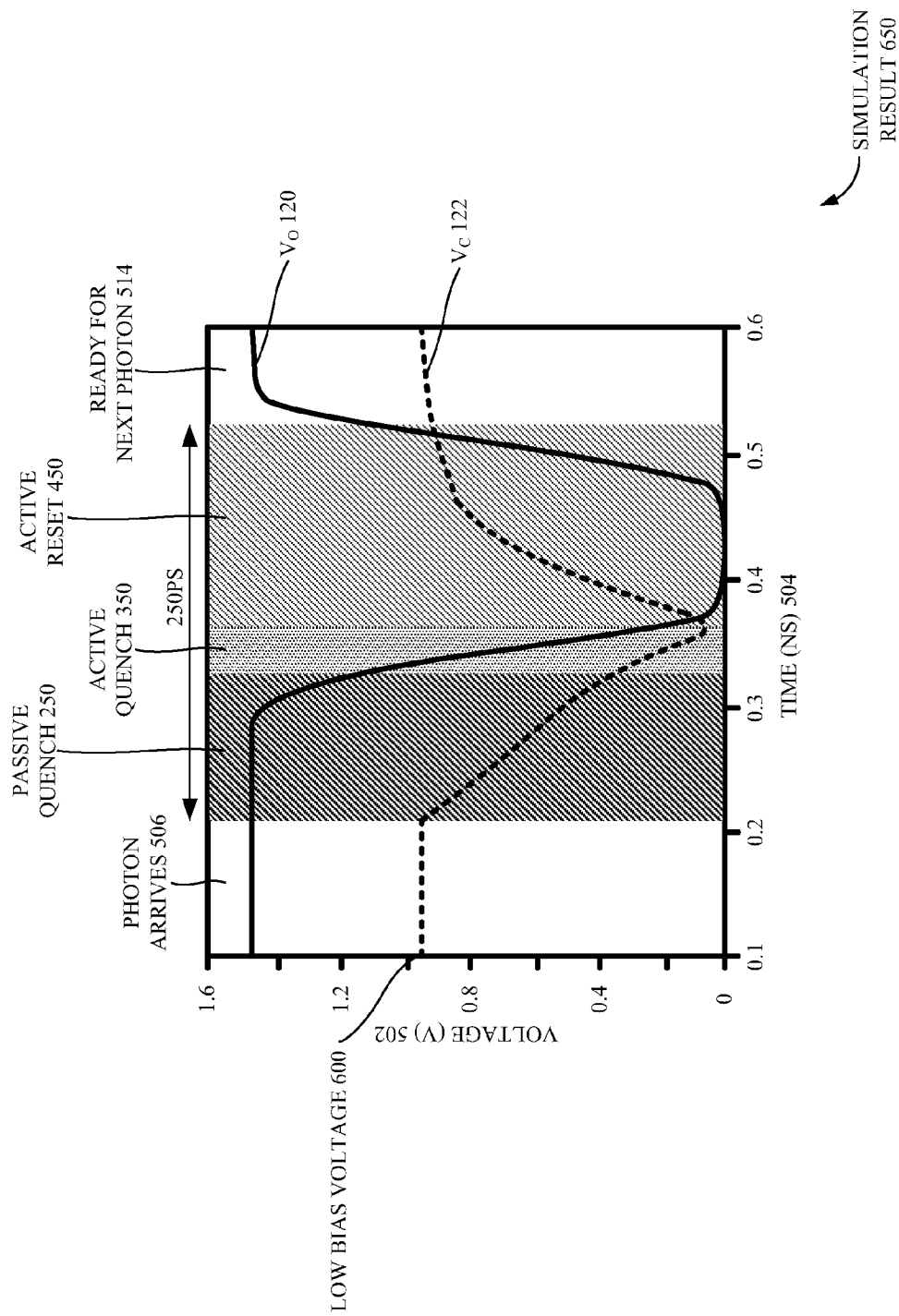
FIG. 6 is a graphical view illustrating a simulation result obtained when the single photon counter was simulated in a circuit simulator, according to one or more embodiments.

FIG. 6 is a graphical view illustrating a simulation result 650 obtained when the single photon counter 150 was simulated in a circuit simulator. In one or more embodiments, the figure illustrates $V_C$ 122 with a low bias voltage of approximately 0.95V. In one or more embodiments, as the photon arriving 506 is incident on the avalanche photodiode 110, the passive quench 250 may be initiated at around 0.21 ns. In one or more embodiments, the active quench 350 may be initiated at 0.33 ns. In one or more embodiments, the active quenching 350 may continue based on the delay provided in the second inverter gate 210. Furthermore, the active reset 450 may be initiated at around 0.36 ns. In one or more embodiments, the active reset 450 may be continued till 0.53 ns until the avalanche photodiode 110 is reset to receive next photon 514. The total dead time as illustrated is approximately around 250 ps from FIG. 6. The FIG. 6 also illustrates output voltage $V_O$ 124 with respect to the $V_C$ 122.

Figure 7:
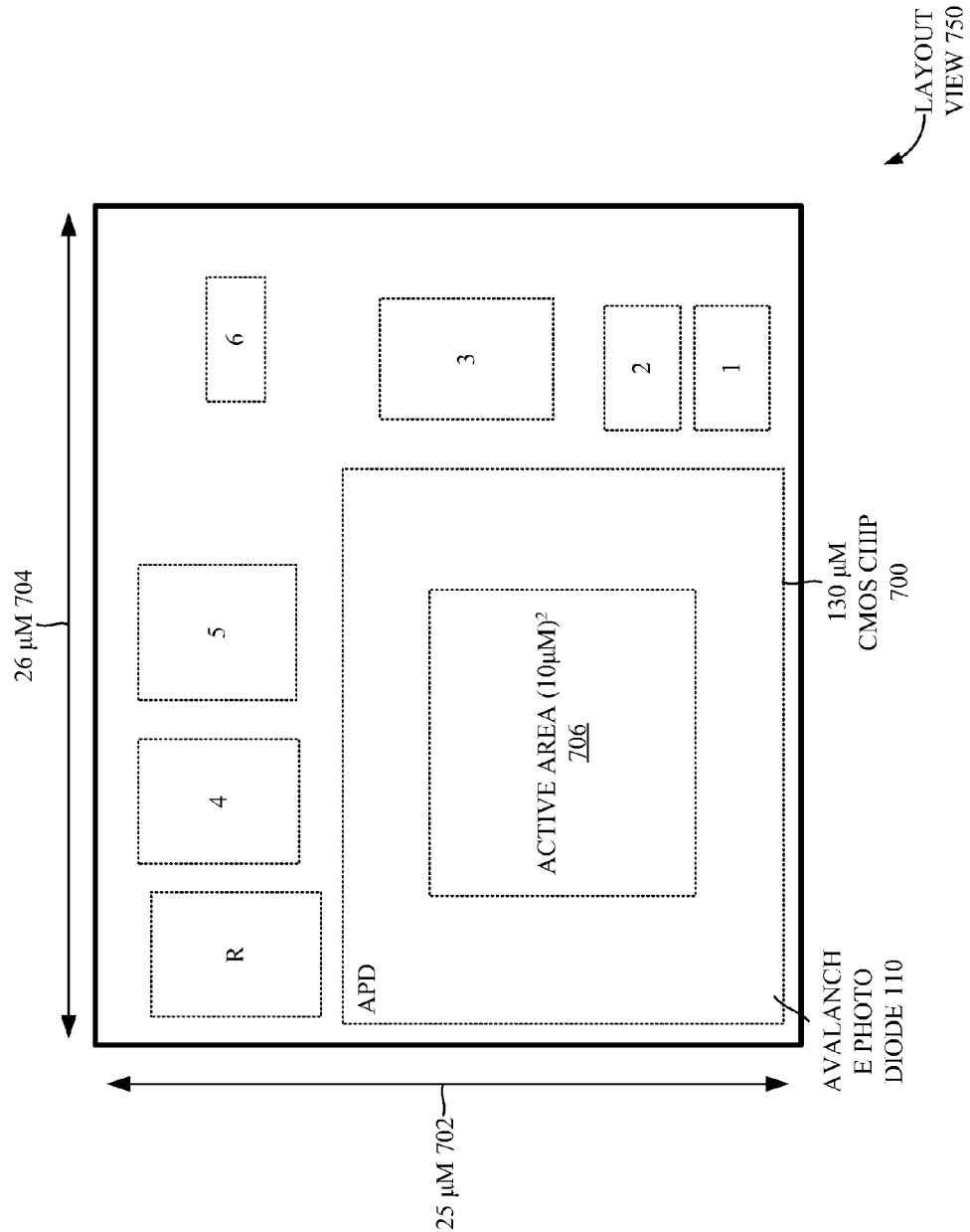
FIG. 7 is a layout view of the single photon counter implemented in a hardware, according to one or more embodiments.

FIG. 7 is a layout view 750 of the single photon counter 150 implemented in a hardware, according to one or more embodiments. In one or more embodiments, the length of the counter 150 may be 25 micrometer 702; the width of the counter 150 may be 26 micrometer 704. In one embodiment, the avalanche photodiode 110 may be implemented in hardware with active area 706 of $10 \times 10 \, \mu m^2$. The component 1 in the layout view represents the NMOS transistor 105, the component 2 represents the NMOS transistor 104, the component 3 represents the PMOS transistor 106, the component 4 represents the first inverter gate 208, the component 5 represents the second inverter gate 210, an the component 6 represents row select NMOS transistor 120. In one or more embodiments, as described above, the sizes of the transistors (e.g., the NMOS transistors 104-105 and the PMOS transistor 106) may be selected carefully in the layout to achieve a delay that will maintain stable operation. In one or more embodiments, the layout may be planned and designed to obtain optimal results.

In one or more embodiments, the layout area of the single photon counter 150 may be proportionally reduced when the number of components needed to operate the circuit is reduced. In addition, a fill factor of the layout area may increase when the first inverter gate 208 and the second inverter gate 210 may be configured and designed in the layout of the single photon counter 150. In one or more embodiments, the fill factor may be an area occupied by the active area 706 of avalanche photodiode as compared to a combined circuit layout area of the avalanche photodiode 110 and remaining portions of the single photon counter 150 hardware.

FIG. 8 is a table view 850 illustrating the dead time 808, a diameter 806 of an active area of the avalanche photo diode, breakdown voltage 810 provided by various technologies 802 and the technology used herein. First row illustrates a Dark Count Rate (DCR) (e.g., where afterpulsing is a part of dark counting) of around 2 kHZ at an excess bias voltage 3 $V_E$, the diameter of the of an active area of the avalanche photodiode being 20 micrometer and providing a dead time of about 40 ns, with a breakdown voltage of 24.0 V for a technology that utilizes 0.35 micrometer CMOS fabrication when the DSM SPAD is implemented on the said technology. The last row represents the result obtained by the single photon counter 150 as described herein. The single photon counter 150 as illustrated herein is built with 0.13 micrometer CMOS technology, DCR being 1 kHz at 0.3 $V_E$, with diameter of an active area of the avalanche photodiode 110 of around 10 micrometer, dead time of around 50 ns with breakdown voltage around 11.3 V. As illustrated, the results clearly indicate an advantage of the single photon counter 150 as described herein. The results illustrate that the single photon counter 150 has lowest DCR due to reduced afterpulsing effect. In addition, the table also illustrates the low dead time of 50 ns for the photon counter 150 as described herein.

Figure 9:
FIG. 9 is a table view illustrating the dead time provided by deep submicron (DSM) single photon avalanche diode (SPAD) with active quench and reset implemented on various other techniques and the technique used herein, according to one or more embodiments.

FIG. 9 is a table view 950 represents the dead time 904, a count rate 906 of a photon by the single photon counter, pixel area 908 upon implementing on various technologies 902. The first row illustrates a SPAD with active quench and active reset mode implemented on a 0.8 µm HV CMOS technology providing a count rate of 30 Mcps (Million counts per second) and a dead time of 34 ns. The layout area of the pixel implementation is not applicable here. The last row illustrates the result obtained by the single photon counter 150 with active quench and reset as described herein. The single photon counter 150 with active quench and reset as illustrated herein is built on a 0.13 µm CMOS technology providing a count rate of 4 billion counts per second and a dead time of 250 ps. The layout area of the pixel implantation is 26 µm×25 µm. As illustrated, the results clearly indicate an advantage of the single photon counter 150 as described herein. The results illustrate that the single photon counter 150 has lowest dead time of 250 ps due to an implementation on the fastest CMOS technology in the table and due to a simpler circuit used in design. In addition, the table also illustrates the highest count rate of 4 Gcps for the smallest pixel layout area 26 µm×25 µm of the single photon avalanche diode with active quench and active reset, when compared to the other implementations of SPAD in the table view 950.

Figure 10:
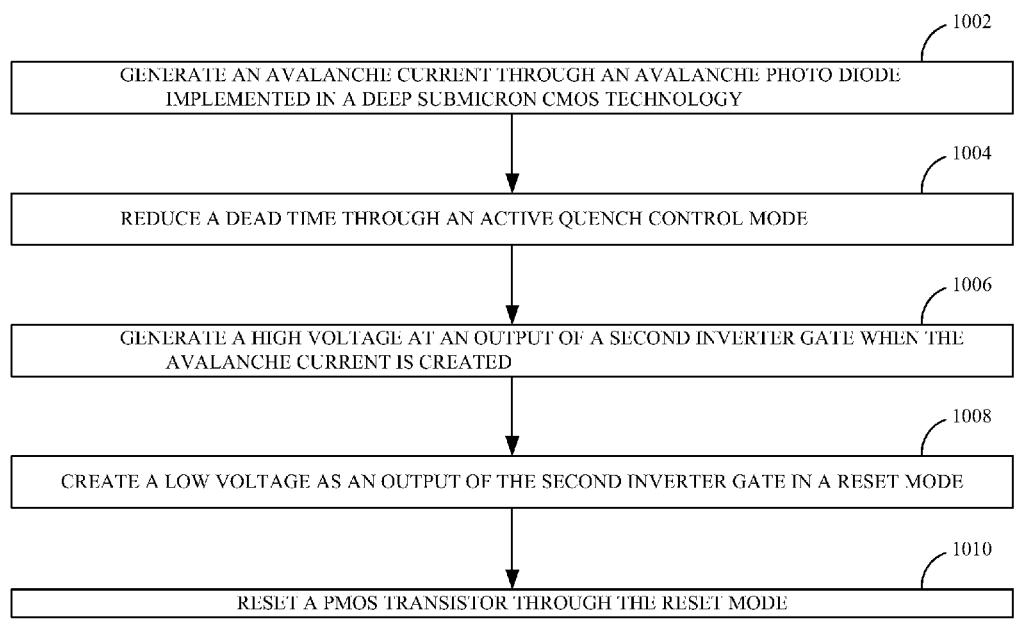
FIG. 10 is a process flow illustrating resetting the avalanche photodiode through turning on the PMOS transistor of the single photon counter, according to one or more embodiments.

FIG. 10 is a process flow illustrating resetting the avalanche photodiode 110 through turning on the PMOS transistor 106 of the single photon counter 150, according to one or more embodiments. In operation 1002, an avalanche current may be generated through an avalanche photodiode 110 implemented in a deep submicron CMOS technology. In operation 1004, a dead time may be reduced through an active quench control circuit. In operation 1006, a high voltage at an output of a second inverter gate 210 may be generated when the avalanche current is created. In operation 1008, a low voltage as an output of the second inverter gate 210 may be created in a reset mode. In operation 1010, the PMOS transistor 106 may be reset through the reset mode.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry (e.g., CMOS based logic circuitry), firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

Figure 11:
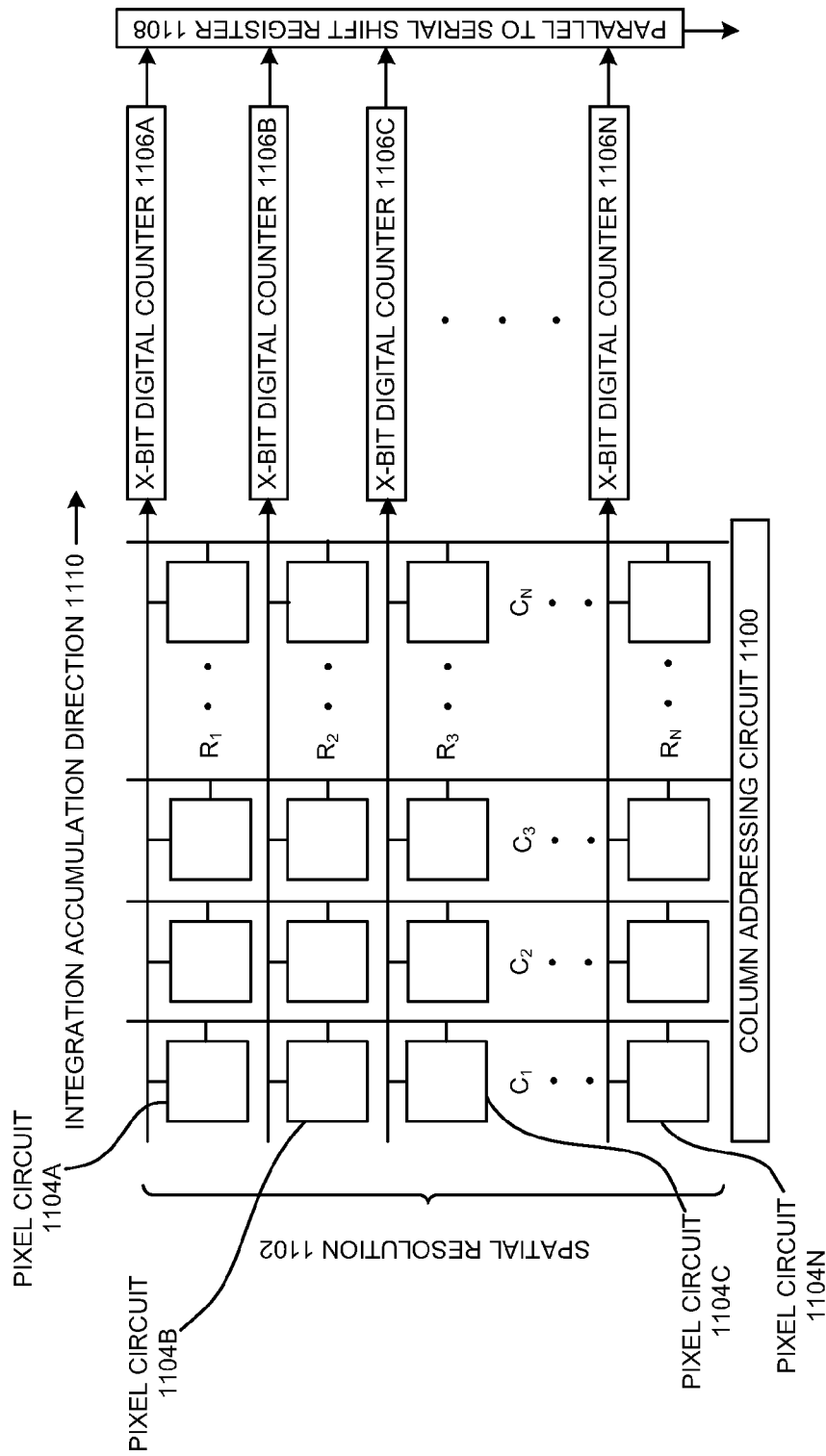
FIG. 11 illustrates an application of digital photon counters in an array of pixel circuits to implement a time-delay integration operation.

FIG. 11 illustrates an application of digital photon counters in an array of pixel circuits to implement a time-delay integration (TDI) operation. TDI may be used to observe high-speed moving objects undetectable by classic CCDs. In one embodiment, TDI may be applied to satellite imaging to synchronize a movement of an image sensor device with the movement of an object captured by the image sensor device. It is assumed that a person of ordinary skill in the art would understand how to implement TDI. In the present figure, an exemplary image sensor device is shown. Each column ($C_{1-N}$) of the image sensor device comprises a plurality of pixel circuits 1104A-N. The spatial resolution 1102 of the sensor device is a function of the rows ($R_{1-N}$) and columns ($C_{1-N}$) of the image sensor device. A column addressing circuit 1100 may facilitate the transfer of charge between pixel circuits 1104A-N.

In one embodiment, a method of TDI includes accumulating, through a column addressing circuit, a plurality of integrations in a plurality of digital counters without resetting a PMOS transistor through the reset mode. Furthermore, the method includes processing, through a parallel to serial shift register, the accumulated plurality of integrations. The circuit inside the pixel may be expressed in FIG. 11 as the plurality of pixel circuits 1104A-N. Each pixel may contain an active quench and reset single photon detector.

The first integration of the plurality of integrations starts at the first column ($C_1$), where the output is connected to an x-bit digital counter. For example, pixel circuit 1104A in column $C_1$ outputs to x-bit digital counter 1106A. In one embodiment, after the first integration, the column addressing circuit 1100 connects the next column to the x-bit digital counter without resetting the counter. The x-bit digital counters 1106A-N will accumulate the photon events of the pixel circuits 1104A-N. After N integrations, the accumulated plurality of integrations will be processed through a parallel to serial shift register 1108 for transmission. The method also involves synchronizing the accumulation of the plurality of integration with a movement of an object captured by an image sensor device before implementing a time-delay integration operation. Synchronization of the integration accumulation direction 1110 with the movement of the object is an integral aspect of this invention in order to guarantee a fast integration time, especially in high speed imaging applications (e.g. satellite imaging). Furthermore, the usage of a single photon counter improves sensitivity and allows a maximum usage of space within the circuit layout.

Figure 12:
FIG. 12 is a process flow chart illustrating a method of a time-delay integration.

FIG. 12 is a process flow chart illustrating a method of a time-delay integration. Specifically, operation 1202 involves accumulating, through a column addressing circuit, a plurality of integrations in a plurality of digital counters without resetting a PMOS transistor through the reset mode. Operation 1204 involves processing, through a parallel to serial shift register, the accumulated plurality of integrations. Operation 1206 involves synchronizing the accumulation of the plurality of integration with a movement of an object captured by an image sensor device before implementing a time-delay integration operation.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed:

1. A light-detection circuit, comprising:
   an avalanche photodiode implemented in a deep submicron CMOS technology;
   a passive quench control circuit of the light-detection circuit to create an avalanche current that generates a high voltage at an output of a second inverter gate of the circuit;
   an active quench control circuit of the light-detection circuit to reduce a dead time of the circuit;
   a reset circuit of the light-detection circuit to create a low voltage at an output of the second inverter gate and to create an active reset of a PMOS transistor of the circuit;
   a column addressing circuit to accumulate a plurality of integrations in a plurality of digital counters without resetting the PMOS transistor;
   a parallel to serial shift register to process the accumulated plurality of integrations; and
      wherein the accumulation of the plurality of integration is synchronized with a movement of an object captured by an image sensor device before implementing a time-delay integration operation.

2. The circuit of claim 1 wherein the avalanche photodiode is operated in a Geiger mode of operation, wherein the passive quench control circuit, the active quench control circuit, and the reset circuit operate in concert to reduce a dead time of the circuit to at most 250 ps.

3. The circuit of claim 2 wherein the deep submicron CMOS technology is a 130 nm CMOS technology having a breakdown voltage of 11.3V.

4. The circuit of claim 3 wherein the light-detection circuit is a single photon counter device that operates the avalanche photodiode at an operating point that reduces an afterpulsing effect.

5. The circuit of claim 4 wherein the avalanche photodiode and at least one of a first inverter gate and the second inverter gate operate at different voltage points.

6. The circuit of claim 5:
   wherein a number of components needed to operate the circuit is reduced when a gate delay of the first inverter gate and the second inverter gate in the circuit replaces a delay circuit,
   wherein a layout area of the circuit is proportionally reduced when the number of components needed to operate the circuit is reduced, and
   wherein a speed of operation of the circuit is increased through the reduction of the number of components.

7. The circuit of claim 6 wherein a fill factor of the layout area to increase when the first inverter gate and the second inverter gate are present in the circuit.

8. The circuit of claim 7 wherein the fill factor is an area occupied by an active area of avalanche photodiode as compared to a combined circuit layout area of the avalanche photodiode and remaining portions of the circuit.

9. A light-detection device comprising:
   an avalanche photodiode implemented in a deep submicron CMOS technology to operate in a Geiger mode of operation; and
   a set of control modules to reduce a dead time of the device, wherein the set of control modules comprises:
      a passive quench control module of the light-detection device to create an avalanche current that generates a high voltage at an output of a second inverter gate of the light-detection device;
      an active quench control module of the light-detection device to reduce a dead time of the light-detection device;
      a reset module of the light-detection device to create a low voltage an output of the second inverter gate and to create an active reset of a PMOS transistor of the light-detection device;
   a column addressing circuit to accumulate a plurality of integrations in a plurality of digital counters without resetting the PMOS transistor;
   a parallel to serial shift register to process the accumulated plurality of integrations; and
      wherein the accumulation of the plurality of integration is synchronized with a movement of an object captured by the light detection device before implementing a time-delay integration operation.

10. The light-detection device of claim 9 wherein the passive quench control module, the active quench control module, and the reset module operate in concert to reduce a dead time of the device to at most 250 ps.

11. The light-detection device of claim 10 wherein the deep submicron CMOS technology is a 130 nm CMOS technology having a breakdown voltage of 11.3V.

12. The light-detection device of claim 11 wherein the light-detection device is a single photon counter device that operates the avalanche photodiode at an operating point that reduces an afterpulsing effect.

13. The light-detection device of claim 12 wherein the avalanche photodiode and at least one of a first inverter gate and the second inverter gate operate at different voltage points.

14. The light-detection device of claim 13:
   wherein a number of components needed to operate the device is reduced when a gate delay of the first inverter gate and the second inverter gate in the light-detection device replaces a delay module,
   wherein a layout area of the light-detection device is proportionally reduced when the number of components needed to operate the light-detection device is reduced, and
   wherein a speed of operation of the light-detection device is increased through the reduction of the number of components.

15. The light-detection device of claim 14 wherein a fill factor of the layout area to increase when the first inverter gate and the second inverter gate are present in the light-detection device.

16. The light-detection device of claim 15 wherein the fill factor is an active area occupied by the avalanche photodiode as compared to a combined light-detection device layout area of the avalanche photodiode and remaining portions of the light-detection device.

17. A method of time-delay integration comprising:
   generating an avalanche current through an avalanche photodiode implemented in a deep submicron CMOS technology;
   reducing a dead time through an active quench control mode;

generating a high voltage at an output of a second inverter gate when the avalanche current is created;

creating a low voltage as an output of the second inverter gate in a reset mode;

accumulating, through a column addressing circuit, a plurality of integrations in a plurality of digital counters without resetting a PMOS transistor through the reset mode;

processing, through a parallel to serial shift register, the accumulated plurality of integrations; and synchronizing the accumulation of the plurality of integration with a movement of an object captured by an image sensor device before implementing a time-delay integration operation.

18. The method of claim 17 wherein the avalanche photodiode is operated in a Geiger mode of operation, wherein a passive quench control mode, the active quench control mode, and the reset mode operate in concert to reduce a dead time to at most 250 ps.

19. The method of claim 18 wherein the deep submicron CMOS technology is a 130 nm CMOS technology having a breakdown voltage of 11.3V.

20. The method of claim 19 wherein reducing an afterpulsing effect in a single photon counter device when the avalanche photodiode is operated at an operating point that enables reducing the afterpulsing.

21. The method of claim 20 wherein the avalanche photodiode and at least one of a first inverter gate and the second inverter gate operate at different voltage points.

22. The method of claim 21:
wherein reducing a number of components when a gate delay of the first inverter gate and the second inverter gate replaces a delay operation,
wherein proportionally reducing a layout area when the number of components reduced, and
wherein increasing a speed of operation through the reduction of the number of components.

23. The method of claim 22 wherein increasing a fill factor of the layout area when the first inverter gate and the second inverter gate are present.

24. The method of claim 23 wherein the fill factor is an active area occupied by the avalanche photodiode as compared to a combined layout area of the avalanche photodiode and remaining components.

* * * * *